US009429619B2

(12) United States Patent
Anemikos et al.

(10) Patent No.: US 9,429,619 B2
(45) Date of Patent: Aug. 30, 2016

(54) RELIABILITY TEST SCREEN OPTIMIZATION

(75) Inventors: Theodoros E. Anemikos, Milton, VT (US); Jeanne P. Bickford, Essex Junction, VT (US); Douglas S. Dewey, Highgate, VT (US); Ernest A. Viau, Jr., Colchester, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 897 days.

(21) Appl. No.: 13/564,337

(22) Filed: Aug. 1, 2012

(65) Prior Publication Data

US 2014/0039664 A1    Feb. 6, 2014

(51) Int. Cl.
G06F 19/00       (2011.01)
G01R 31/28       (2006.01)
G05B 19/418      (2006.01)
G01R 31/317      (2006.01)

(52) U.S. Cl.
CPC ......... *G01R 31/2894* (2013.01); *G01R 31/287* (2013.01); *G01R 31/2855* (2013.01); *G01R 31/2868* (2013.01); *G01R 31/2879* (2013.01); *G01R 31/31718* (2013.01); *G05B 19/41875* (2013.01)

(58) Field of Classification Search
CPC ..................... G05B 23/00–23/0297
USPC ........................................ 700/121
See application file for complete search history.

(56) References Cited

U.S. PATENT DOCUMENTS

| 5,519,333 | A  |   | 5/1996  | Righter |
|-----------|----|---|---------|---------|
| 6,807,655 | B1 | * | 10/2004 | Rehani et al. ............ 716/136 |
| 7,139,630 | B1 | * | 11/2006 | Clougherty ....... G05B 19/4183 438/14 |
| 7,409,306 | B2 | * | 8/2008  | Singh et al. .................... 702/81 |
| 7,475,366 | B2 |   | 1/2009  | Kuemerle et al. |
| 7,533,359 | B2 | * | 5/2009  | Scheffer et al. ............. 716/106 |
| 7,642,105 | B2 |   | 1/2010  | Co et al. |
| 7,810,054 | B2 |   | 10/2010 | Anemikos et al. |
| 7,877,714 | B2 |   | 1/2011  | Anemikos et al. |
| 7,886,164 | B1 |   | 2/2011  | Alben et al. |
| 8,543,960 | B1 | * | 9/2013  | Bickford et al. ............ 716/132 |
| 8,872,536 | B1 | * | 10/2014 | Trimberger ....... G01R 31/2894 324/757.03 |
| 2001/0034865 | A1 | * | 10/2001 | Park et al. .................... 714/724 |
| 2002/0187602 | A1 | * | 12/2002 | Miura et al. ................. 438/201 |
| 2003/0120445 | A1 |   | 6/2003  | Barbour et al. |
| 2003/0120457 | A1 | * | 6/2003  | Singh et al. ................. 702/181 |
| 2003/0151422 | A1 |   | 8/2003  | Barnett et al. |
| 2005/0041454 | A1 | * | 2/2005  | Schultz et al. ................. 365/91 |
| 2005/0083077 | A1 | * | 4/2005  | Fleury et al. ................. 324/765 |
| 2007/0143718 | A1 | * | 6/2007  | Abercrombie et al. ......... 716/4 |

(Continued)

*Primary Examiner* — Sean Shechtman
(74) *Attorney, Agent, or Firm* — Gibb & Riley, LLC; Anthony J. Canale

(57) ABSTRACT

Methods and systems optimize power usage in an integrated circuit design by sorting the integrated circuit devices after manufacture into relatively slow integrated circuit devices and relatively fast integrated circuit devices to classify the integrated circuit devices into different voltage bins. The methods and systems establish a bin-specific reliability testing processes for each of the voltage bins and test the integrated circuit devices using a tester. This allows the methods and systems to identify as defective ones of the integrated circuit devices that fail the bin-specific integrated circuit reliability testing processes of a corresponding voltage bin. The methods and systems remove the defective ones of the integrated circuit devices to allow only non-defective integrated circuit devices to remain and supply the non-defective integrated circuit devices to a customer.

25 Claims, 9 Drawing Sheets

(56) References Cited

U.S. PATENT DOCUMENTS

2007/0206412 A1* 9/2007 Masago et al. ............... 365/177
2008/0034337 A1 2/2008 Kuemerle et al.
2009/0228843 A1 9/2009 Anemikos et al.
2010/0017042 A1 1/2010 Lopata
2010/0268367 A1* 10/2010 Wu et al. ...................... 700/110
2013/0326459 A1* 12/2013 Bickford et al. ............. 716/133
2014/0107822 A1* 4/2014 Chadwick et al. ............ 700/95

* cited by examiner

RELIABILITY TEST SCREEN OPTIMIZATION

BACKGROUND

The embodiments of the invention generally relate to optimizing power usage in integrated circuit designs and more particularly to methods and designs that sort identical integrated circuit devices into voltage bins and perform reliability testing of such integrated circuit devices differently for each of the different voltage bins.

Manufacturing variations may cause one or more parameters to vary between integrated circuits that are formed according to the same design. These variations can affect chip operating frequency (i.e., switching speed). For example, due to variations in the equipment, operators, position on a wafer, etc., a specific parameter may vary between chips built on the same wafer, chips built on different wafers in the same lot and/or on chips built on different wafers in different lots. If this parameter is, for example, channel length, width or threshold voltages of the transistors of each chip may be different such that the performance varies (e.g., faster or slower). Chips that are fabricated either at the "slow" end or the "fast" end of a process distribution (e.g., a process-temperature-variation (PVT) space) may not be desirable. For example, chips that are fabricated at the "slow" end of such a process distribution may not meet the desired performance specification (i.e., may not have a fast enough switching speed), whereas chips fabricated at the "fast" end of this process distribution may exhibit excessive power and leakage current. Thus, it is possible to run faster parts at lower voltage and slower parts at higher voltage, in order to reduce the maximum power for the distribution of parts. The division between the fast and slow portions of the distribution (i.e. the cutpoint), is generally determined a priori during the design phase.

SUMMARY

According to one embodiment herein, a method of optimizing power usage in an integrated circuit design used to manufacture integrated circuit devices according to an integrated circuit design using manufacturing equipment. The integrated circuit design produces integrated circuit devices that are identically designed, but perform at different operating speeds caused by manufacturing process variations. The method sorts the integrated circuit devices after manufacture into relatively slow integrated circuit devices and relatively fast integrated circuit devices to classify the integrated circuit devices into different voltage bins. The relatively fast integrated circuit devices consume more power than the relatively slow integrated circuit devices. The relatively fast integrated circuit devices meet performance requirements at a lower voltage. The relatively slow integrated circuit devices use higher voltages. The method establishes a bin-specific reliability testing processes comprising enhanced voltage screening and dynamic voltage screening for each of the voltage bins and tests the integrated circuit devices using a tester. This allows the method to identify as defective ones of the integrated circuit devices that fail the bin-specific integrated circuit reliability testing processes of a corresponding voltage bin into which each of the digital circuits has been classified. The method removes the defective ones of the integrated circuit devices to allow only non-defective integrated circuit devices to remain and supplies the non-defective integrated circuit devices to a customer.

According to another embodiment herein, a method of optimizing power usage in an integrated circuit design manufactures integrated circuit devices according to an integrated circuit design using manufacturing equipment. The integrated circuit design produces integrated circuit devices that are identically designed, but perform at different operating speeds caused by manufacturing process variations. The method sorts the integrated circuit devices after manufacture into relatively slow integrated circuit devices and relatively fast integrated circuit devices to classify the integrated circuit devices into different voltage bins. The relatively fast integrated circuit devices consume more power than the relatively slow integrated circuit devices. The relatively fast integrated circuit devices meet performance requirements at a lower voltage. The relatively slow integrated circuit devices use higher voltages. The method establishes a bin-specific reliability testing processes comprising burn-in testing for each of the voltage bins and tests the integrated circuit devices using a tester. This allows the method to identify as defective ones of the integrated circuit devices that fail the bin-specific integrated circuit reliability testing processes of a corresponding voltage bin into which each of the digital circuits has been classified. The method removes the defective ones of the integrated circuit devices to allow only non-defective integrated circuit devices to remain and supplies the non-defective integrated circuit devices to a customer.

According to a further embodiment herein, a method of optimizing power usage in an integrated circuit design manufactures integrated circuit devices according to an integrated circuit design using manufacturing equipment. The integrated circuit design produces integrated circuit devices that are identically designed, but perform at different operating speeds caused by manufacturing process variations. The method sorts the integrated circuit devices after manufacture into relatively slow integrated circuit devices and relatively fast integrated circuit devices to classify the integrated circuit devices into different voltage bins. The relatively fast integrated circuit devices consume more power than the relatively slow integrated circuit devices. The relatively fast integrated circuit devices meet performance requirements at a lower voltage. The relatively slow integrated circuit devices use higher voltages. The method establishes a bin-specific reliability testing processes comprising enhanced voltage screening and dynamic voltage screening for each of the voltage bins and tests the integrated circuit devices using a tester. This allows the method to identify as defective ones of the integrated circuit devices that fail the bin-specific integrated circuit reliability testing processes of a corresponding voltage bin into which each of the digital circuits has been classified. The method removes the defective ones of the integrated circuit devices to allow only non-defective integrated circuit devices to remain and operatively connects a plurality of the non-defective integrated circuit devices to a power controller to create a device.

According to yet another embodiment herein, a method of optimizing power usage in an integrated circuit design manufactures integrated circuit devices according to an integrated circuit design using manufacturing equipment. The integrated circuit design produces integrated circuit devices that are identically designed, but perform at different operating speeds caused by manufacturing process variations. The method sorts the integrated circuit devices after manufacture into relatively slow integrated circuit devices and relatively fast integrated circuit devices to classify the integrated circuit devices into different voltage bins. The relatively fast integrated circuit devices consume more power than the relatively slow integrated circuit devices. The relatively fast integrated circuit devices meet performance requirements at a lower voltage. The relatively slow integrated circuit devices use higher voltages. The method establishes a bin-specific reliability testing processes comprising burn-in testing for each of the voltage bins and tests the integrated circuit devices using a tester. This allows the method to identify as defective ones of the integrated circuit devices that fail the bin-specific integrated circuit reliability testing processes of a corresponding voltage bin into which each of the digital circuits has been classified. The method removes the defective ones of the integrated circuit devices to allow only non-defective integrated circuit devices to remain and operatively connects a plurality of the non-defective integrated circuit devices to a power controller to create a device.

According to an additional embodiment herein, a method of optimizing power usage in an integrated circuit design manufactures integrated circuit devices according to an integrated circuit design using manufacturing equipment. The integrated circuit design produces integrated circuit devices that are identically designed, but perform at different operating speeds caused by manufacturing process variations. The method sorts the integrated circuit devices after manufacture into relatively slow integrated circuit devices and relatively fast integrated circuit devices to classify the integrated circuit devices into different voltage bins. The relatively fast integrated circuit devices consume more power than the relatively slow integrated circuit devices. The relatively fast integrated circuit devices meet performance requirements at a lower voltage. The relatively slow integrated circuit devices use higher voltages. The method establishes a bin-specific reliability testing processes comprising enhanced voltage screening and dynamic voltage screening, and burn-in testing for each of the voltage bins and tests the integrated circuit devices using a tester. The differences between each different bin-specific reliability testing process can be based on design limits, and limits that are based on empirical testing at operating conditions. This allows the method to identify as defective ones of the integrated circuit devices that fail the bin-specific integrated circuit reliability testing processes of a corresponding voltage bin into which each of the digital circuits has been classified. The method removes the defective ones of the integrated circuit devices to allow only non-defective integrated circuit devices to remain and operatively connects a plurality of the non-defective integrated circuit devices to a power controller to create a device.

BRIEF DESCRIPTION OF THE DRAWINGS

The embodiments herein will be better understood from the following detailed description with reference to the drawings, which are not necessarily drawing to scale and in which.

DETAILED DESCRIPTION

As mentioned above, the process of selective voltage binning can run faster parts at lower voltage and slower parts at higher voltage, in order to reduce the maximum power for the distribution of parts. Thus, selective voltage binning reduces maximum chip power by running fast process chips at lower voltages.

Reliability screen such as enhanced voltage screening (EVS), dynamic voltage screening (DVS), and burn in process conventionally apply one test for each product; however, with selective voltage binning, system use conditions are different for fast versus slow products. More specifically, as mentioned above, a lower voltage is used for faster parts, and a higher voltage is used for slower parts. Conventional reliability screens sometimes unnecessarily scrap parts because the same tests are applied to all parts. Further, while some types of testing and screening are discussed herein (EVS, DVS, etc.) those ordinarily skilled in the art would understand that the systems and method herein are applicable to all forms of testing and screening, whether currently known or developed in the future, and that the screening described herein are merely examples used to illustrate the features of the embodiments disclosed herein.

However, with the methods and systems herein, faster parts from the lower voltage bins are processed through reliability screening at lower voltages because they will be operated at lower voltages once placed in service. This provides the committed system reliability, with fewer scrapped parts. Thus, screening faster parts at lower voltage results in lower power at test conditions, less expensive test equipment being required, consistent field reliability, lower power consumption, reduced test and burn-in times, reduced cost, increased throughput, and improved yield with no system impact. The methods and systems herein meet system reliability objectives with improved yield, with a less expensive test solution (lower power) and reduced burn-in.

One exemplary reliability screen process according to systems and methods herein identifies system operating conditions for each selective voltage bin, and performs EVS (enhanced voltage screening) and DVS (dynamic voltage screening) at different conditions (e.g., different voltages) established for each different selective voltage bin. Then, these systems and methods scrap the products based on failure of the voltage bin-specific test conditions. Another exemplary reliability screening process herein identifies system operating conditions for each selective voltage bin, and indentifies unique burn-in conditions for each different voltage bin. Again, the products that fail during burn-in are scrapped.

Figure 1:
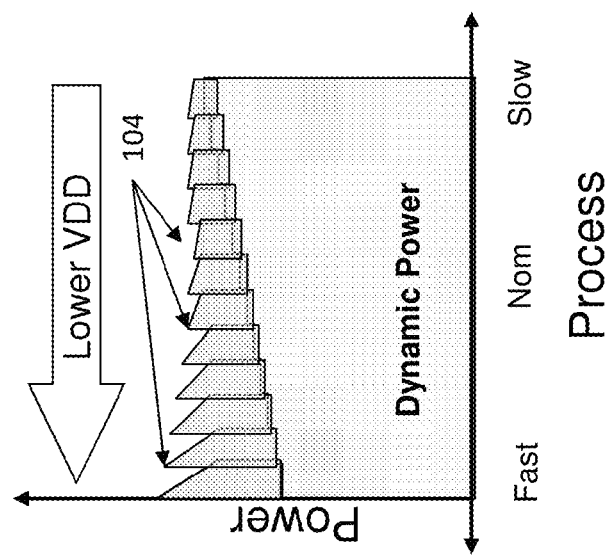
FIG. 1 is a chart illustrating the relationship between process speed and power usage for integrated circuits manufactured with the same process.
Figure 2:
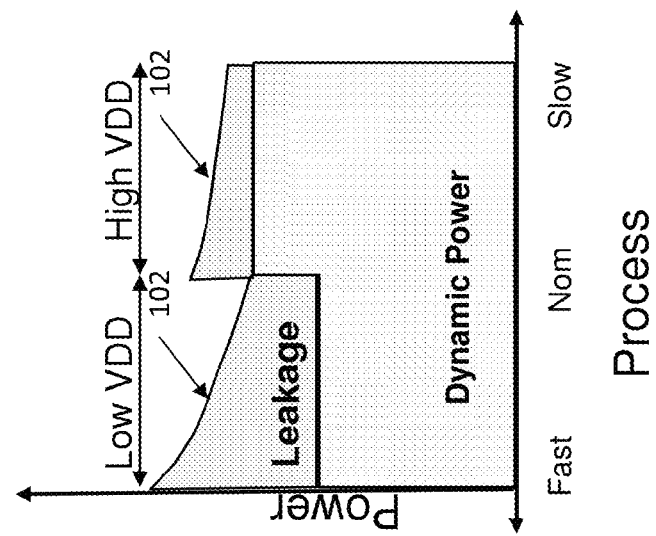
FIG. 2 is a chart illustrating the relationship between process speed and power usage for integrated circuits manufactured with the same process using a 2-bin selective binning process.
Figure 3:
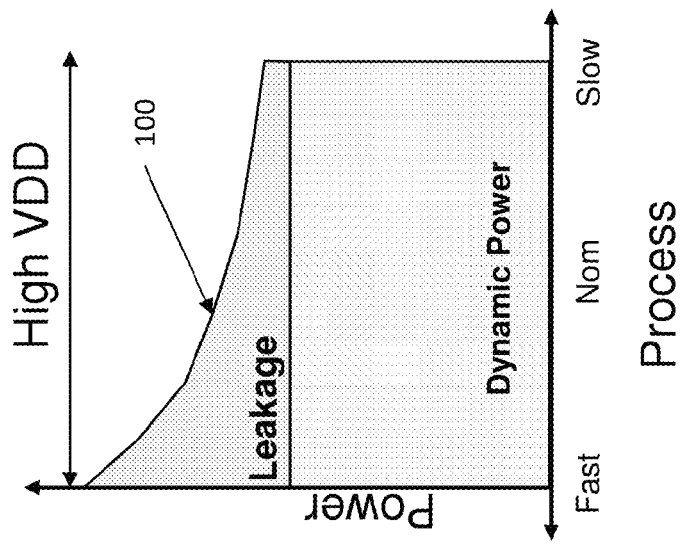
FIG. 3 is a chart illustrating the relationship between process speed and power usage for integrated circuits manufactured with the same process using a multi-bin selective binning process.

FIG. 1 is a chart illustrating the relationship between process speed and power usage for identically manufactured integrated circuit devices. FIG. 2 is a chart illustrating the relationship between process speed and power usage for integrated circuits manufactured with the same process using a 2-bin selective binning process, and FIG. 3 is a chart illustrating the relationship between process speed and power usage for integrated circuits manufactured with the same process using a multi-bin selective binning process.

Post-manufacturing voltage binning is a technique that is used to sort manufactured chips into bins based on whether they were fabricated at either the "slow" end or the "fast" end of a process distribution, and to vary the voltage requirements for the chips depending upon the bins they are assigned to in order to reduce maximum chip power. For example, FIG. 1 is a diagram illustrating the dynamic power and process speed for chips that are manufactured from a common design, but that are different because of different processing conditions that occur within acceptable manufacturing tolerances.

In FIG. 1, the fast-case process range on curve 100 drives the required voltage for ultimately running the chip, creating an unnecessarily high operating voltage. However, with selective voltage binning shown in FIGS. 2 and 3, every chip is tested to measure operating speed and the chips are sorted into voltage bins accordingly. This reduces maximum chip power by running fast process chips at lower Vdd, as shown by curves 102 and 104. Thus, the devices are binned by process, and slow chips are operated at standard Vdd without change to slow-corner voltage, timing, and power (because slow-corner power is not limiting). However, as shown in FIGS. 2-3, fast chips are operated at reduced Vdd because the fast chips have speed to spare, and at reduced Vdd, power is reduced.

For example, in a process-voltage-temperature space, the temperature and voltage of the chip may be fixed and the leakage may be measured. If the leakage is above a specific cut point, then the chip is on the fast end of the process-voltage-temperature space and placed in a fast chip bin. If the leakage is below the cut point, then the chip is on the slow end of the process-voltage-temperature space and placed in a slow chip bin. After the chips are sorted into bins according to the cut point, an optimal supply voltage (Vdd) for operating the chips in each bin is determined.

Figure 4:
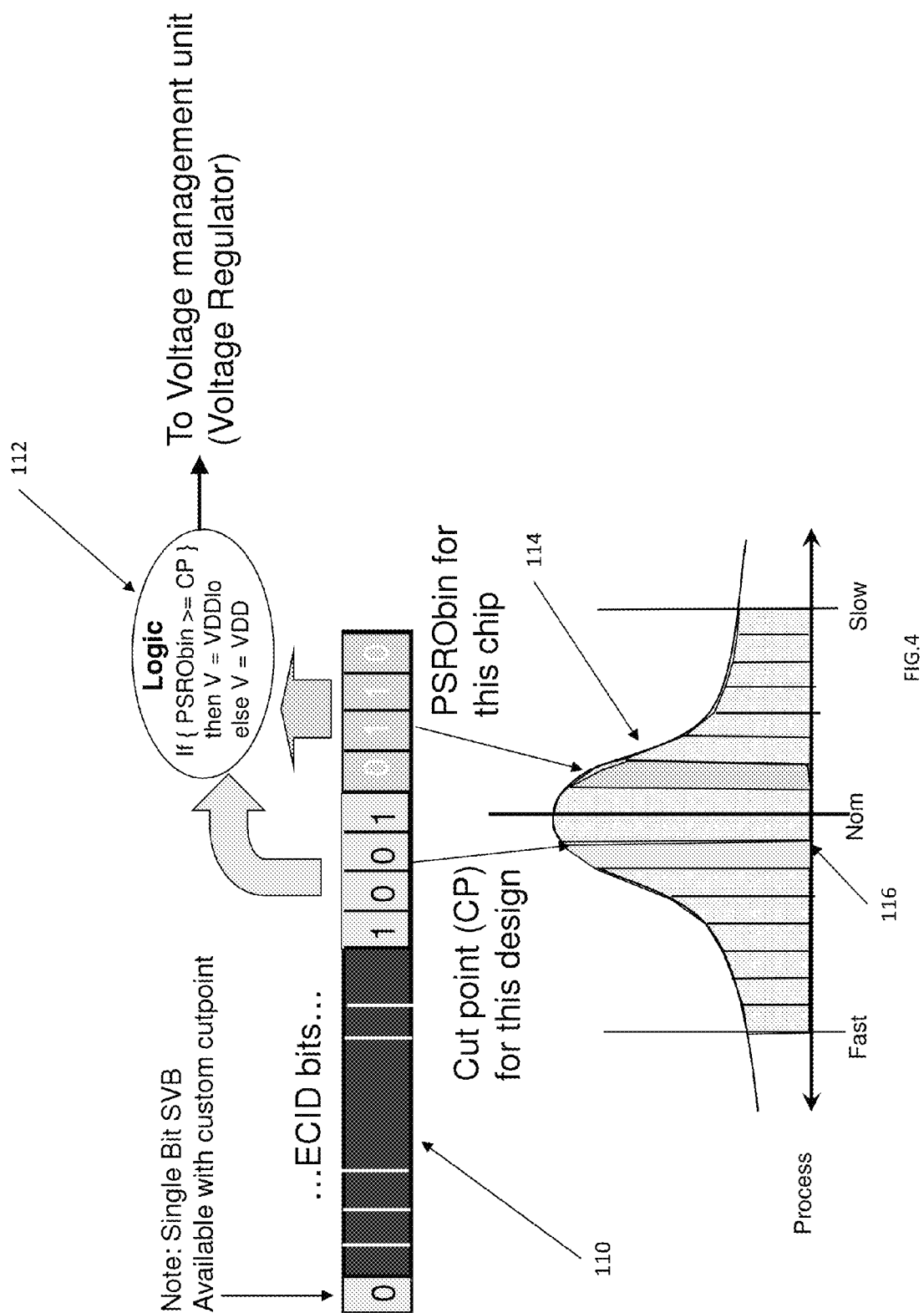
FIG. 4 is a chart illustrating the cut points of selective voltage binning.

In FIG. 4, item 116 represents the selective voltage binning (SVB) cut point between what is considered to be a fast device and what is considered to be a slow device along curve 114. The fast devices will sorted into the "fast" bin and will be utilized at lower voltages than the slow devices that are sorted into the "slow" bin. The fast devices will consume more power if operated at the standard, non-lowered voltage.

In FIG. 4, item 110 represents the electronic chip identification data (ECID) that will be stored on the chip. Thus, the ECID value is burned into the device based on process, the customer reads the ECID (which can be tied to an input/output (IO)) to determine voltage levels on board, and the customer handles setting power supply voltages differently based upon ECID value. Further, timing closure runs are adjusted for SVB. Thus, item 110 defines the "performance sorting ring oscillator" (PSRO)) and current leakage criteria for a particular bin on each part. Part of this information includes the identification of the cut point use by logic 112 to supply information to the voltage management unit (voltage regulator). As shown in FIG. 4 the logic 112 can alter the voltage at which the specific device operates.

Figure 5:
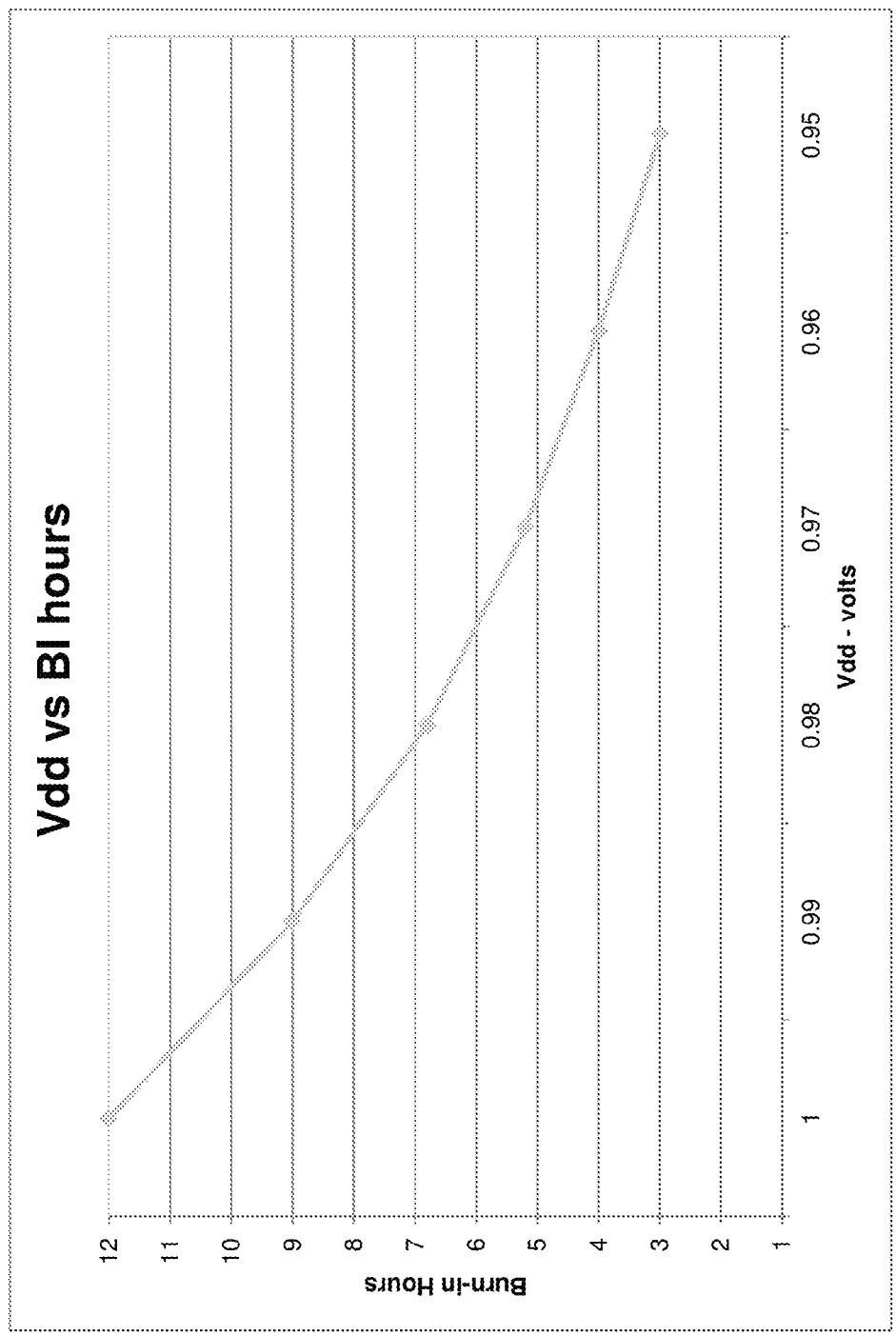
FIG. 5 is a chart illustrating voltage verse burn-in hours.
Figure 6:
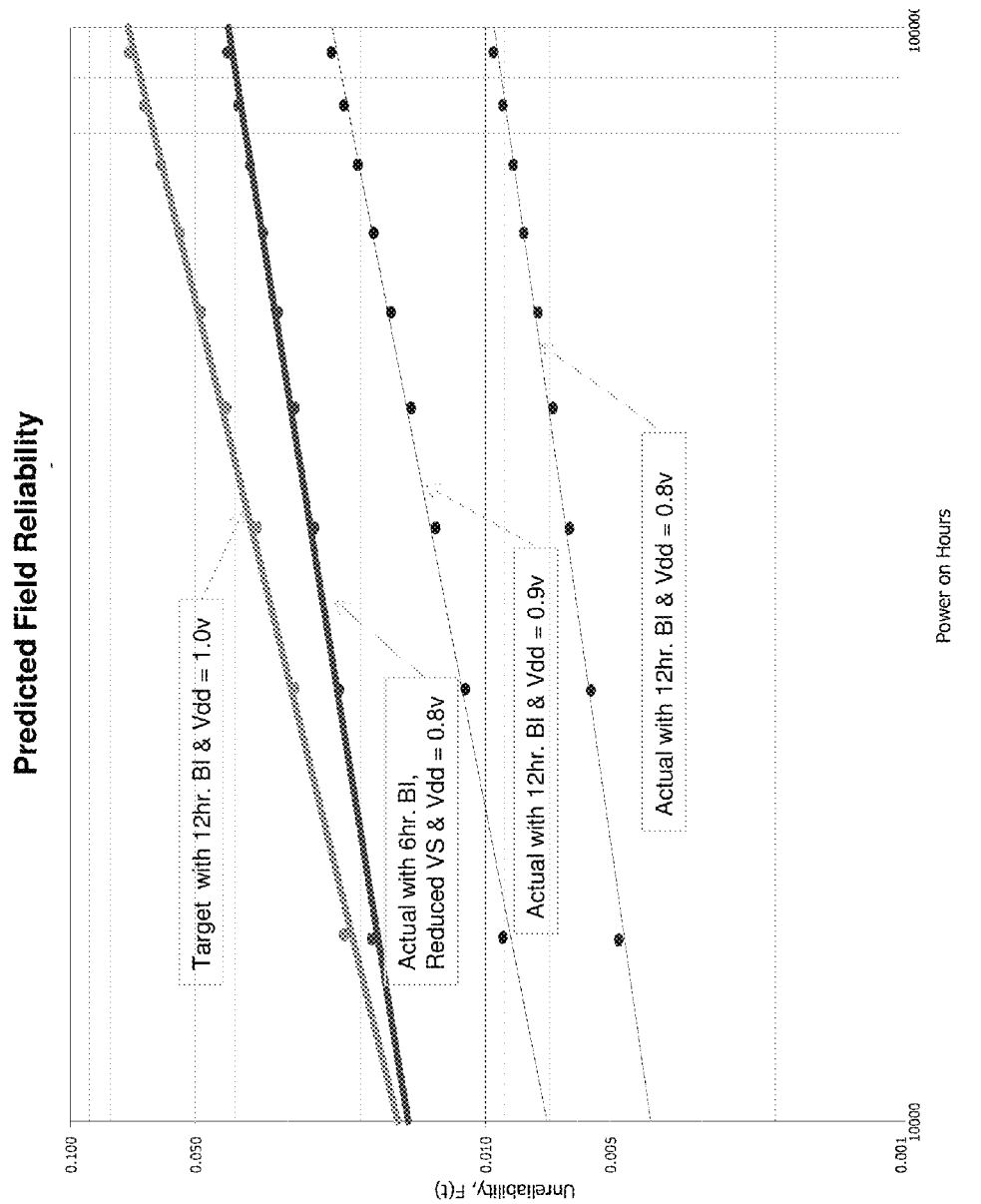
FIG. 6 is a chart illustrating failure versus power-on hours.

FIG. 5 is a chart illustrating a burn-in example for a part that requires 12 hours of burn-in to meet customer reliability, with a field Vdd of 1.0 v and Tj of 85 C. FIG. 6 is a chart of failures in parts per million (PPM) over power on hours. The top line in FIG. 6 shows the target number of failures with a 12 hour burn-in, with Vdd being at 1.0 v. The second line from the top in FIG. 6 shows the actual number of failures with a 6 hour burn-in, with Vdd being at 0.8 v. The third line from the top in FIG. 6 shows the actual number of failures with a 12 hour burn-in, with Vdd being at 0.9 v. The fourth line from the top in FIG. 6 shows the actual number of failures with a 12 hour burn-in, with Vdd being at 0.8 v.

Therefore, FIG. 6 illustrates that integrated circuit devices (chips) that are binned into lower voltage bins and are placed into service at lower than standard voltages (0.8 v and 0.9 v, for example), but still receive a full 12 hour burn-in have substantially less failures than those devices placed into service at normal operating voltages (1.0 v) or those that receive shorter burn-in periods (6 hours).

Figure 7:
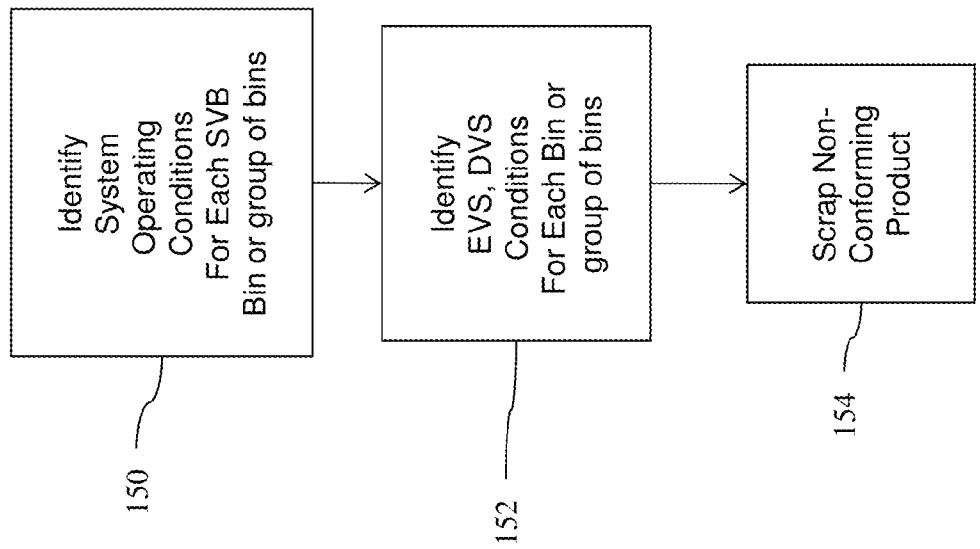
FIG. 7 is a flow diagram illustrating a process of using reliability testing processes within a selective voltage binning operation.

FIG. 7 is a block diagram illustrating the overall logical operation of the various methods and devices herein relating to EVS and DVS screening. In item 150, the systems and methods herein identify the system operating conditions for each voltage bin or group of bins. Next, in item 152, the systems and methods herein identify EVS and DVS conditions for each bin or group of bins, which uses lower power testing for lower power (faster) binned devices. As shown in item 154 in FIG. 7, the systems and methods herein applies EVS and DVS testing and scraps any non-conforming product, but the lower power testing produces less scrap.

Figure 8:
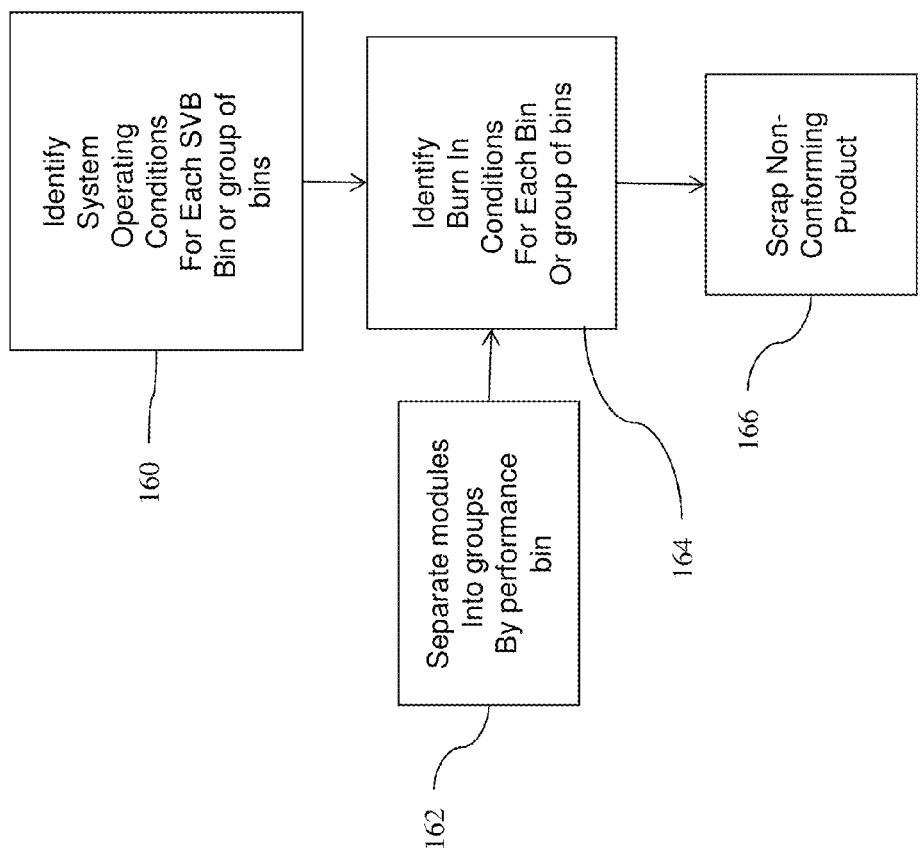
FIG. 8 is a flow diagram illustrating a process of using reliability testing processes within a selective voltage binning operation.

FIG. 8 is similarly a block diagram illustrating the overall logical operation of the various methods and devices herein relating to burn-in testing. In item 160 the systems and methods herein identify the system operating conditions for each voltage bin or group of bins. Next, in item 162 the systems and methods herein separate the devices into groups by performance bin. In item 164 the systems and methods herein identify burn in conditions for each bin or group of bins which uses lower power testing for lower power (faster) binned devices. In item 166, the systems and methods herein performs burn-in and scraps any non-conforming product, but the lower power testing produces less scrap.

Figure 9:
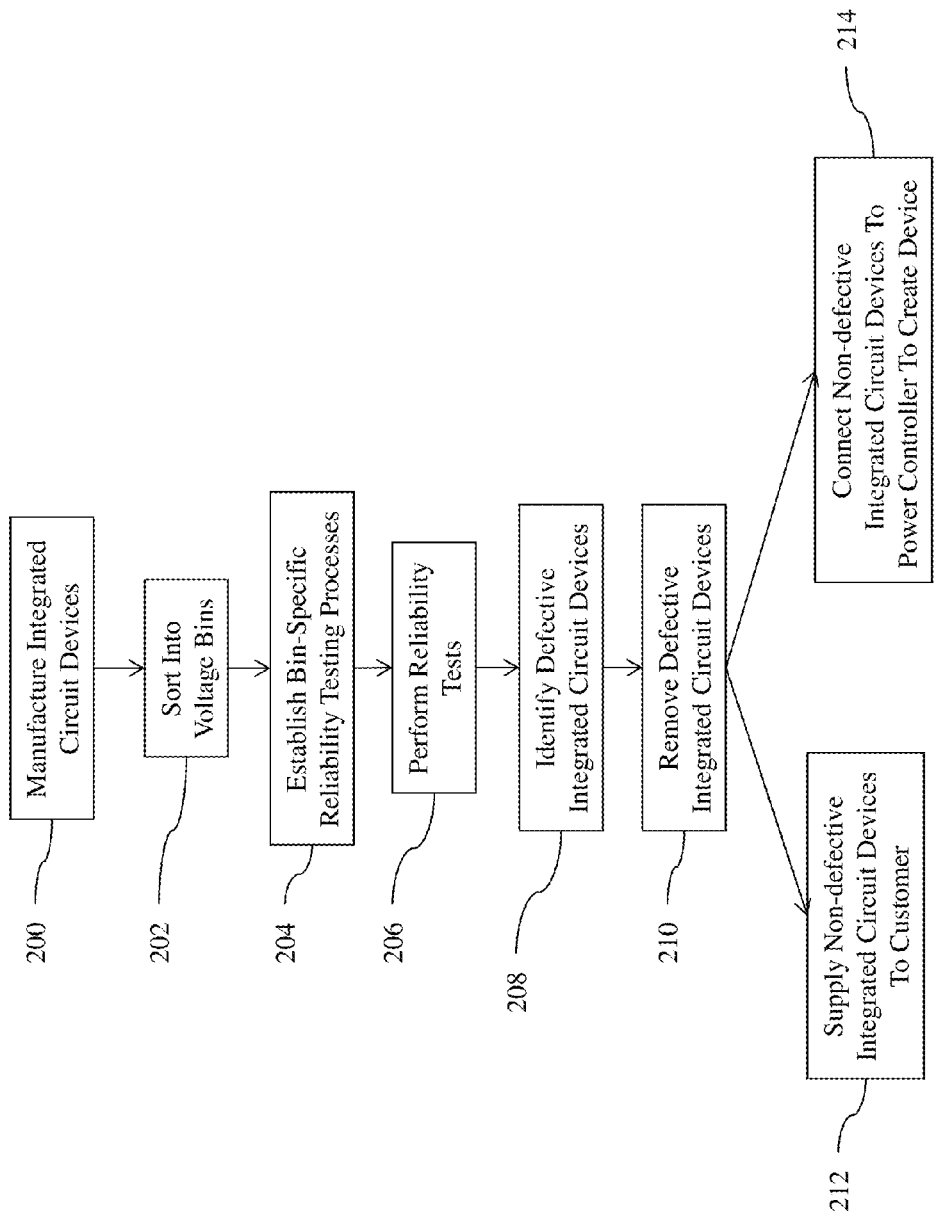
FIG. 9 is a flow diagram illustrating a process of using reliability testing processes within a selective voltage binning operation.

FIG. 9 is a flow diagram illustrating an exemplary method herein that optimizes power usage in an integrated circuit design. In item 200 this exemplary method manufactures integrated circuit devices according to an integrated circuit design using manufacturing equipment. The integrated circuit design produces integrated circuit devices that are identically designed, but perform at different operating speeds caused by manufacturing process variations.

In item 202 this exemplary method divides the integrated circuit devices after manufacture into relatively slow integrated circuit devices and relatively fast integrated circuit devices to classify the integrated circuit devices into different voltage bins. The relatively fast integrated circuit devices consume more power than the relatively slow integrated circuit devices. The relatively fast integrated circuit devices meet performance requirements at a lower voltage. The relatively slow integrated circuit devices use higher voltages. When establishing the limits for the different voltage bins, the limits are established such that the relatively slow integrated circuit devices and relatively fast integrated circuit devices to consume a same maximum power.

In item 204 this exemplary method establishes bin-specific reliability testing processes for each of the voltage bins and tests the reliability of the integrated circuit devices using a tester in item 206. In item 204, the differences between each different bin-specific reliability testing process can be based on design limits, and limits that are based on empirical testing at operating conditions. This allows the method to identify as defective ones of the integrated circuit devices that fail the bin-specific integrated circuit reliability testing processes of a corresponding voltage bin (into which each of the digital circuits has been classified in item 202) in item 208. The method removes the defective ones of the integrated circuit devices in item 210 to allow only non-defective integrated circuit devices to remain. These non-defective integrated circuit devices can be supplied to a customer (item 212) or a plurality of the non-defective integrated circuit devices can be operatively connected to a power controller to create a device (item 214).

Figure 10:
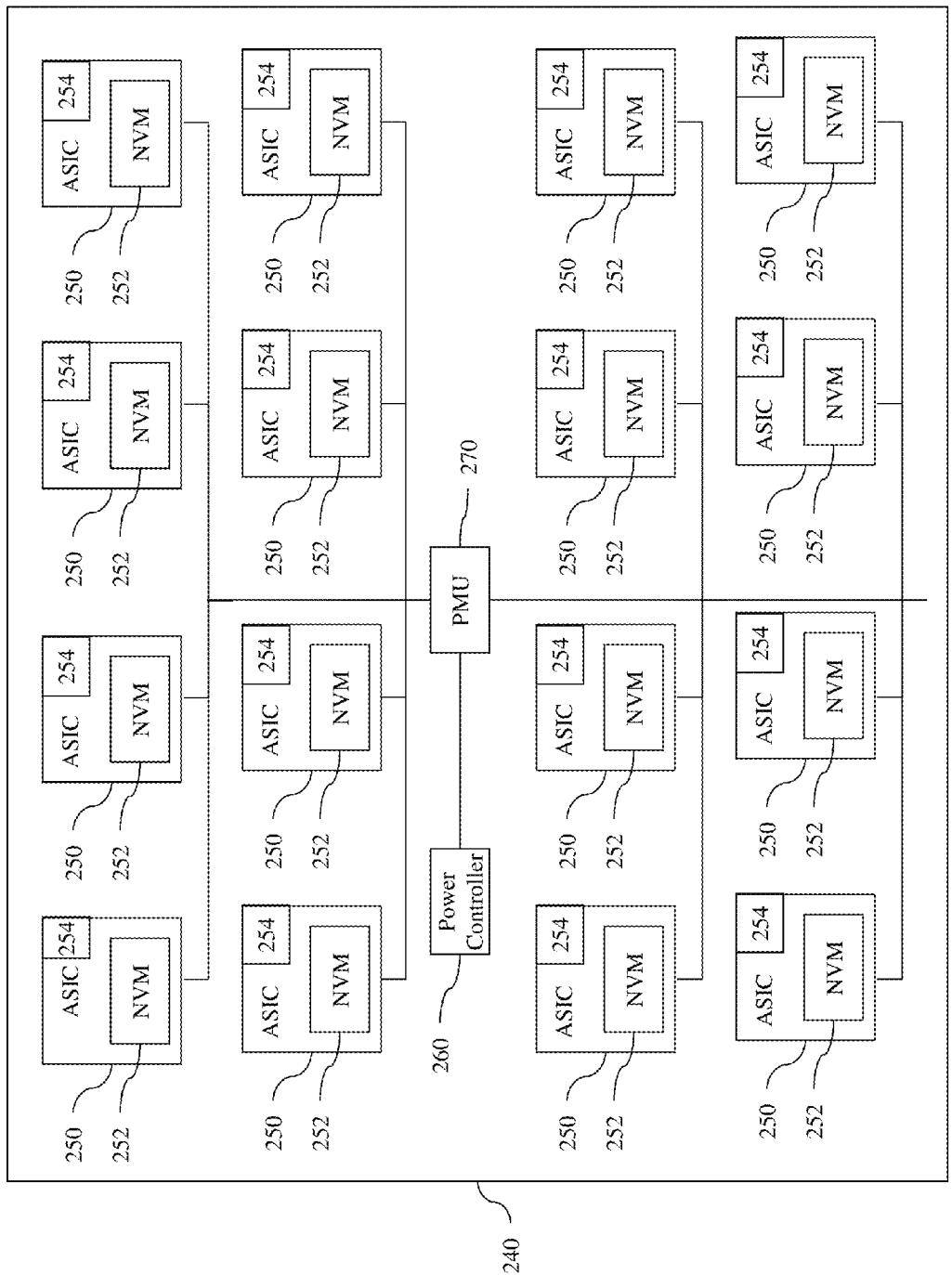
FIG. 10 is a schematic diagram of a device containing many integrated circuit devices that have been sorted into different voltage bins and that are controlled using a power controller.

FIG. 10 illustrates an additional embodiment herein which is a device (support) 240 that comprises a plurality of digital circuits 250 manufactured from an identical circuit design, a power controller/tester 260 operatively connect to the digital circuits, and a non-transitory storage medium 252 operatively connected to the power controller/tester 260. In this example all the digital circuits 250 are application specific integrated circuits (ASIC); however, as would be understood by those ordinarily skilled in the art, any device could be used with the embodiments herein. As mentioned above, the digital circuits 250 are classified into different voltage bins, and each of the voltage bins are with a different reliability testing processes. Thus, each of the digital circuits 250 is tested to operate within a voltage range of a corresponding voltage bin. The non-transitory storage medium (sometimes also referred to as non-volatile memory (NVM)) 252 stores boundaries of the voltage bins. The power controller 260 controls power-supply signals applied differently for each of the digital circuits 250 based on which bin each of the digital circuit has been classified.

The voltage bin data has been generated and stored in the non-transitory storage medium 252 during production testing of the digital circuits. The non-transitory storage medium 252 can comprise, for example, a programmable fuse block. The power controller/tester 260 determines a speed constraint for a task to be executed by a given digital circuit 250 based on a voltage bin to which the digital circuit has been classified, and the power controller/tester 260 also specifies levels of the power-supply signals for execution of the task based on such a speed constraint. Some embodiments can also include a sensor 254 that senses the temperature of a given digital circuit. Additional embodiments can also include a power management unit (PMU) 270 that receives instructions from the power controller/tester 260 regarding levels of the power-supply signals and generates the power-supply signals based on the instructions.

Thus, test device 260 can be operatively (directly or indirectly) connected to the integrated circuit devices through the support 240. Also, a non-transitory storage medium 252 can be operatively connected to the test device. The test device performs testing according to instructions stored in the non-transitory storage medium.

The instructions causing the test device to perform a method that sorts the integrated circuit devices after manufacture into relatively slow integrated circuit devices and relatively fast integrated circuit devices to classify the integrated circuit devices into different voltage bins. The relatively fast integrated circuit devices consume more power than the relatively slow integrated circuit devices. The relatively fast integrated circuit devices meet performance requirements at a lower voltage. The relatively slow integrated circuit devices use higher voltages. The method establishes a bin-specific reliability testing processes comprising enhanced voltage screening and dynamic voltage screening for each of the voltage bins and tests the integrated circuit devices using a tester. This allows the method to identify as defective ones of the integrated circuit devices that fail the bin-specific integrated circuit reliability testing processes of a corresponding voltage bin into which each of the digital circuits has been classified. The method removes the defective ones of the integrated circuit devices to allow only non-defective integrated circuit devices to remain and supplies the non-defective integrated circuit devices to a customer.

As will be appreciated by one skilled in the art, aspects of the systems and methods herein may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 11:
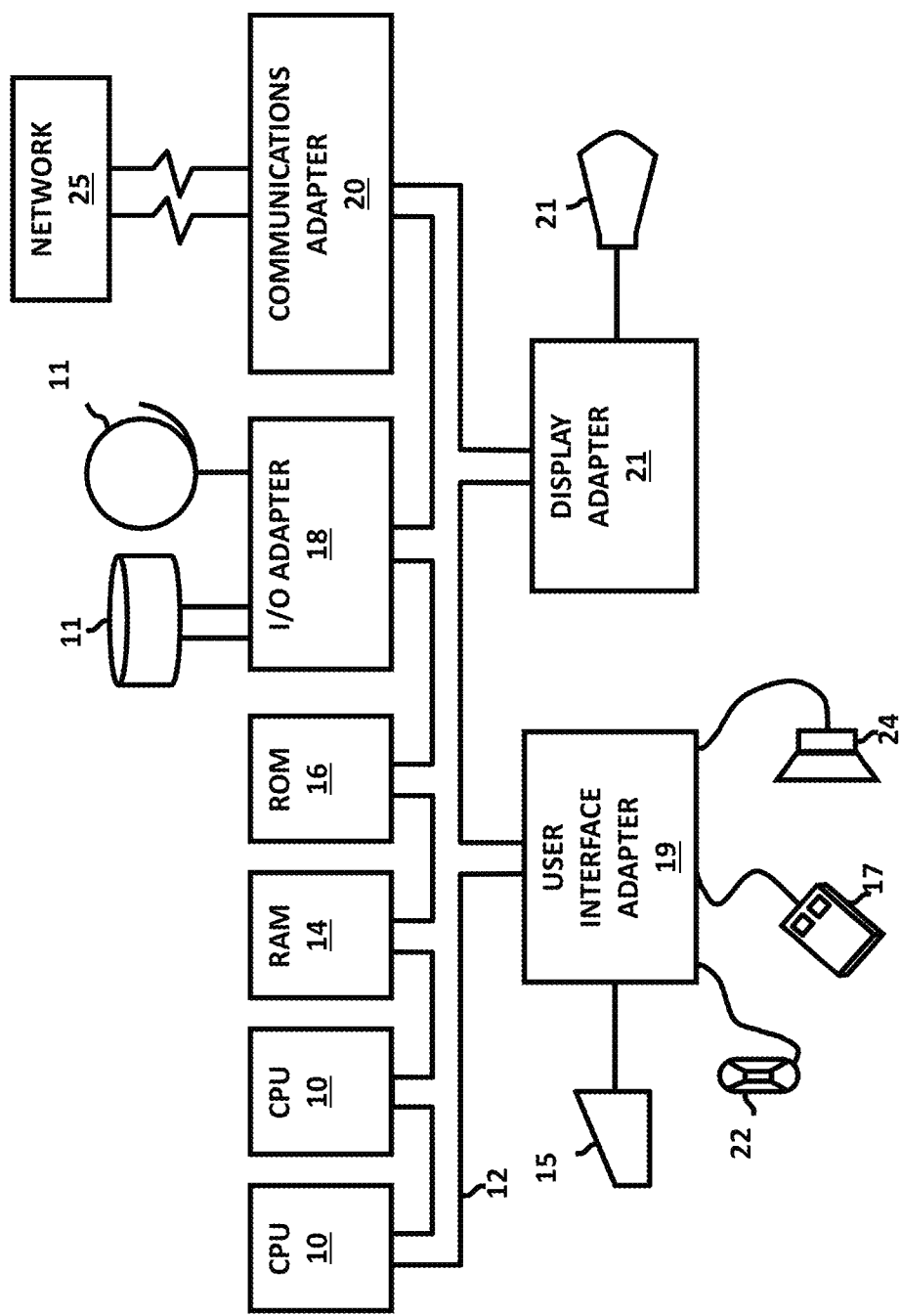
FIG. 11 is a schematic diagram of a hardware system according to embodiments herein.

A representative hardware environment for practicing the embodiments herein is depicted in FIG. 11. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The flowchart and block diagrams in the Figures illustrate the architecture, functionality, and operation of possible implementations of systems, methods and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of optimizing power usage in an integrated circuit design, said method comprising:

manufacturing integrated circuit devices according to an integrated circuit design using manufacturing equipment, said integrated circuit design producing integrated circuit devices that are identically designed and perform at different operating speeds caused by manufacturing process variations;

sorting said integrated circuit devices after manufacture into relatively slow integrated circuit devices and relatively fast integrated circuit devices to classify said integrated circuit devices into different voltage bins, said relatively fast integrated circuit devices having a smaller delay and consuming more power than said relatively slow integrated circuit devices, establishing a bin-specific reliability testing processes comprising enhanced voltage screening and dynamic voltage screening for each of said voltage bins;

performing reliability testing using said bin-specific reliability testing processes for each of said voltage bins on said integrated circuit devices using a tester;

identifying as defective ones of said integrated circuit devices that fail said bin-specific reliability testing processes of a corresponding voltage bin into which each of said integrated circuit devices has been classified;

removing said defective ones of said integrated circuit devices to allow only non-defective integrated circuit devices to remain; and supplying said non-defective integrated circuit devices to a customer.

2. The method of claim 1, further comprising setting said relatively slow integrated circuit devices to operate at a higher operating power relative to said fast integrated circuit devices.

3. The method of claim 1, further comprising embedding bin identification in said integrated circuit devices.

4. The method of claim 3, further comprising:

reading said bin identification using a power controller operatively connected to said integrated circuit devices;

determining a speed constraint for a task to be executed by a digital circuit based on a voltage bin to which said digital circuit has been classified using said power controller; and specifying levels of power-supply signals for execution of said task based on said speed constraint using said power controller.

5. The method of claim 1, said relatively fast integrated circuit devices meet performance requirements at a relatively lower voltage than said relatively slow integrated circuit devices meet said performance requirements.

6. A method of optimizing power usage in an integrated circuit design, said method comprising:

manufacturing integrated circuit devices according to an integrated circuit design using manufacturing equipment, said integrated circuit design producing integrated circuit devices that are identically designed and perform at different operating speeds caused by manufacturing process variations;

sorting said integrated circuit devices after manufacture into relatively slow integrated circuit devices and relatively fast integrated circuit devices to classify said integrated circuit devices into different voltage bins, said relatively fast integrated circuit devices having a smaller delay and consuming more power than said relatively slow integrated circuit devices, establishing a bin-specific reliability testing processes comprising burn-in testing for each of said voltage bins;

performing reliability testing using said bin-specific reliability testing processes for each of said voltage bins on said integrated circuit devices using a tester;

identifying as defective ones of said integrated circuit devices that fail said bin-specific reliability testing processes of a corresponding voltage bin into which each of said integrated circuit devices has been classified;

removing said defective ones of said integrated circuit devices to allow only non-defective integrated circuit devices to remain; and supplying said non-defective integrated circuit devices to a customer.

7. The method of claim 6, further comprising setting said relatively slow integrated circuit devices to operate at a higher operating power relative to said fast integrated circuit devices.

8. The method of claim 6, further comprising embedding bin identification in said integrated circuit devices.

9. The method of claim 8, further comprising:

reading said bin identification using a power controller operatively connected to said integrated circuit devices;

determining a speed constraint for a task to be executed by a digital circuit based on a voltage bin to which said digital circuit has been classified using said power controller; and specifying levels of power-supply signals for execution of said task based on said speed constraint using said power controller.

10. The method of claim 6, said relatively fast integrated circuit devices meet performance requirements at a relatively lower voltage than said relatively slow integrated circuit devices meet said performance requirements.

11. A method of optimizing power usage in an integrated circuit design, said method comprising:

manufacturing integrated circuit devices according to an integrated circuit design using manufacturing equipment, said integrated circuit design producing integrated circuit devices that are identically designed and perform at different operating speeds caused by manufacturing process variations;

sorting said integrated circuit devices after manufacture into relatively slow integrated circuit devices and relatively fast integrated circuit devices to classify said integrated circuit devices into different voltage bins, said relatively fast integrated circuit devices having a smaller delay and consuming more power than said relatively slow integrated circuit devices, establishing a bin-specific reliability testing processes comprising enhanced voltage screening, and dynamic voltage screening for each of said voltage bins;

performing reliability testing using said bin-specific reliability testing processes for each of said voltage bins on said integrated circuit devices using a tester;

identifying as defective ones of said integrated circuit devices that fail said bin-specific reliability testing processes of a corresponding voltage bin into which each of said integrated circuit devices has been classified;

removing said defective ones of said integrated circuit devices to allow only non-defective integrated circuit devices to remain; and operatively connecting a plurality of said non-defective integrated circuit devices to a power controller to create a device.

12. The method of claim 11, further comprising setting said relatively slow integrated circuit devices to operate at a higher operating power relative to said fast integrated circuit devices.

13. The method of claim 11, further comprising embedding bin identification in said integrated circuit devices.

14. The method of claim 13, further comprising:
reading said bin identification using a power controller operatively connected to said integrated circuit devices;
determining a speed constraint for a task to be executed by a digital circuit based on a voltage bin to which said digital circuit has been classified using said power controller; and
specifying levels of power-supply signals for execution of said task based on said speed constraint using said power controller.

15. The method of claim 11, said relatively fast integrated circuit devices meet performance requirements at a relatively lower voltage than said relatively slow integrated circuit devices meet said performance requirements.

16. A testing system comprising:
a support having a plurality of integrated circuit devices mounted thereon, said integrated circuit devices being manufactured from an identical circuit design, and said integrated circuit devices performing at different operating speeds based on manufacturing process variations;
a test device operatively connected to said integrated circuit devices through said support; and
a non-transitory storage medium operatively connected to said test device,
said test device performing testing according to instructions stored in said non-transitory storage medium,
said instructions causing said test device to perform a method comprising:
sorting said integrated circuit devices after manufacture into relatively slow integrated circuit devices and relatively fast integrated circuit devices to classify said integrated circuit devices into different voltage bins, said relatively fast integrated circuit devices having a smaller delay and consuming more power than said relatively slow integrated circuit devices,
establishing a bin-specific reliability testing processes comprising burn-in testing for each of said voltage bins;
performing reliability testing using said bin-specific reliability testing processes for each of said voltage bins on said integrated circuit devices using a tester;
identifying as defective ones of said integrated circuit devices that fail said bin-specific reliability testing processes of a corresponding voltage bin into which each of said integrated circuit devices has been classified;
removing said defective ones of said integrated circuit devices to allow only non-defective integrated circuit devices to remain; and
operatively connecting a plurality of said non-defective integrated circuit devices to a power controller to create a device.

17. The testing system of claim 16, said method further comprising setting said relatively slow integrated circuit devices to operate at a higher operating power relative to said fast integrated circuit devices.

18. The testing system of claim 16, said method further comprising embedding bin identification in said integrated circuit devices.

19. The testing system of claim 18, said method further comprising:
reading said bin identification using a power controller operatively connected to said integrated circuit devices;
determining a speed constraint for a task to be executed by a digital circuit based on a voltage bin to which said digital circuit has been classified using said power controller; and
specifying levels of power-supply signals for execution of said task based on said speed constraint using said power controller.

20. The testing system of claim 16, said relatively fast integrated circuit devices meet performance requirements at a relatively lower voltage than said relatively slow integrated circuit devices meet said performance requirements.

21. A non-transitory computer storage medium storing instructions and being readable by a computerized device, said instructions causing said computerized device to perform a method of optimizing power usage in an integrated circuit design, said method comprising:
receiving integrated circuit devices manufactured according to an integrated circuit design using manufacturing equipment, said integrated circuit design producing integrated circuit devices that are identically designed and perform at different operating speeds caused by manufacturing process variations;
sorting said integrated circuit devices after manufacture into relatively slow integrated circuit devices and relatively fast integrated circuit devices to classify said integrated circuit devices into different voltage bins, said relatively fast integrated circuit devices having a smaller delay and consuming more power than said relatively slow integrated circuit devices,
establishing a bin-specific reliability testing processes based on design limits and limits based on empirical testing at operating conditions, said establishing of said bin-specific reliability testing processes comprising enhanced voltage screening, dynamic voltage screening, and burn-in testing for each of said voltage bins;
performing reliability testing using said bin-specific reliability testing processes for each of said voltage bins on said integrated circuit devices using a tester;
identifying as defective ones of said integrated circuit devices that fail said bin-specific reliability testing processes of a corresponding voltage bin into which each of said integrated circuit devices has been classified;
removing said defective ones of said integrated circuit devices to allow only non-defective integrated circuit devices to remain; and
operatively connecting a plurality of said non-defective integrated circuit devices to a power controller to create a device.

22. The non-transitory computer storage medium of claim 21, said method further comprising setting said relatively slow integrated circuit devices to operate at a higher operating power relative to said fast integrated circuit devices.

23. The non-transitory computer storage medium of claim 21, said method further comprising embedding bin identification in said integrated circuit devices.

24. The non-transitory computer storage medium of claim 23, said method further comprising:
reading said bin identification using a power controller operatively connected to said integrated circuit devices;

determining a speed constraint for a task to be executed by a digital circuit based on a voltage bin to which said digital circuit has been classified using said power controller; and specifying levels of power-supply signals for execution of said task based on said speed constraint using said power controller.

25. The non-transitory computer storage medium of claim 21, said relatively fast integrated circuit devices meet performance requirements at a relatively lower voltage than said relatively slow integrated circuit devices meet said performance requirements.

\* \* \* \* \*